United States Patent
Hsieh et al.

(10) Patent No.: US 8,102,058 B2
(45) Date of Patent: Jan. 24, 2012

(54) CHIP PACKAGE STRUCTURE AND METHOD FOR FABRICATING THE SAME

(75) Inventors: Ming-Che Hsieh, Kaohsiung (TW); Ra-Min Tain, Taipei County (TW); Wei Li, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 186 days.

(21) Appl. No.: 12/748,334

(22) Filed: Mar. 26, 2010

(65) Prior Publication Data

US 2011/0108973 A1    May 12, 2011

(30) Foreign Application Priority Data

Nov. 12, 2009  (TW) .............................. 98138372 A

(51) Int. Cl.
*H01L 23/52* (2006.01)
*H01L 23/48* (2006.01)
*H01L 23/40* (2006.01)

(52) U.S. Cl. ................ 257/774; 257/E21.597; 257/686; 257/775; 438/629; 438/639; 438/667

(58) Field of Classification Search ........... 257/E21.597, 257/E23.011, E23.145, 686, 698, 758, 762, 257/763, 767, 771, 773, 774, 775; 438/667, 438/629, 637, 639, 640, 668, 672, 675, 700, 438/701, 713, 978
See application file for complete search history.

(56) References Cited

U.S. PATENT DOCUMENTS

| | | | |
|---|---|---|---|
| 5,411,400 A | 5/1995 | Subrahmanyan et al. | |
| 5,432,999 A * | 7/1995 | Capps et al. | 438/109 |
| 6,222,276 B1 * | 4/2001 | Bertin et al. | 257/778 |
| 7,173,577 B2 | 2/2007 | Brown et al. | |
| 7,436,069 B2 * | 10/2008 | Matsui | 257/774 |
| 7,579,553 B2 * | 8/2009 | Moriizumi | 174/260 |
| 7,898,086 B2 * | 3/2011 | Egawa | 257/774 |
| 2003/0085471 A1 * | 5/2003 | Iijima et al. | 257/774 |
| 2004/0007779 A1 | 1/2004 | Arbuthnot et al. | |
| 2007/0052101 A1 * | 3/2007 | Usami | 257/758 |
| 2007/0170595 A1 * | 7/2007 | Sinha | 257/774 |
| 2007/1022854 | 10/2007 | Hsu et al. | |
| 2009/0108443 A1 | 4/2009 | Jiang | |
| 2009/0152611 A1 * | 6/2009 | Fujimoto | 257/296 |
| 2009/0212438 A1 * | 8/2009 | Kreupl et al. | 257/773 |
| 2011/0056740 A1 * | 3/2011 | Takano | 174/262 |
| 2011/0115097 A1 * | 5/2011 | Shau | 257/774 |
| 2011/0210426 A1 * | 9/2011 | Matsui | 257/621 |

* cited by examiner

*Primary Examiner* — Chris Chu

(57) ABSTRACT

The disclosure provides a chip package structure and method for fabricating the same. The chip package structure includes at least one chip having at least one through via. At least one stress buffering structure is disposed in the through via. The stress buffering structure includes a first gasket and a second gasket. A supporting pillar has two terminals respectively connected to the first gasket and the second gasket. The cross-sectional area of the supporting pillar is smaller than areas of the first gasket and the second gasket. A buffering layer is sandwiched between the first gasket and the second gasket, surrounding a sidewall of the supporting pillar. An insulating layer is disposed on the through via, surrounding a sidewall of the stress buffering structure.

21 Claims, 10 Drawing Sheets

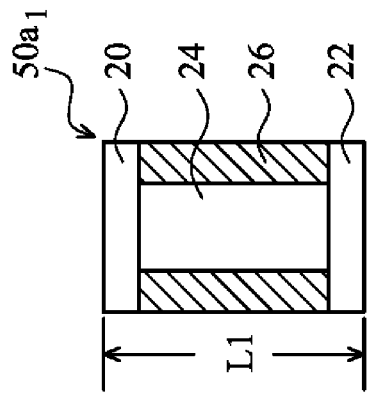
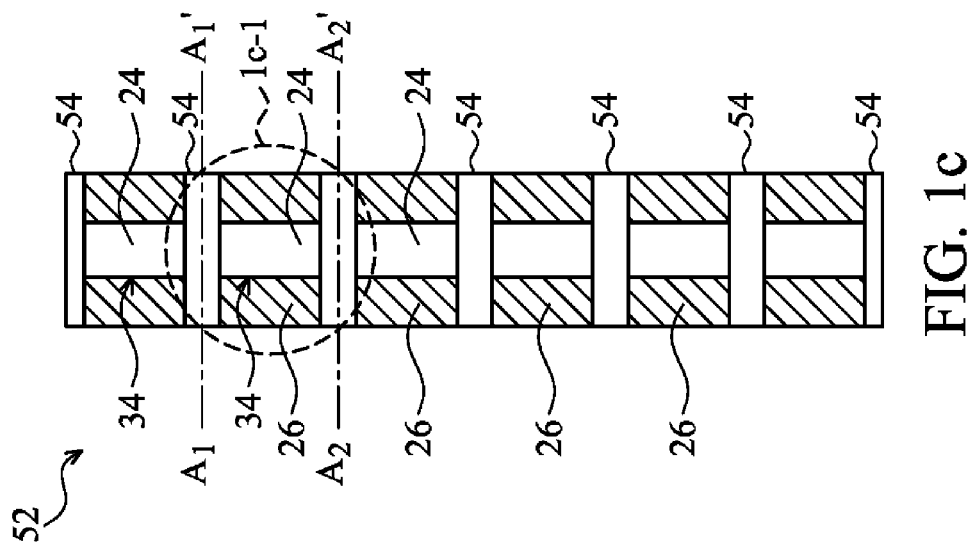

US 8,102,058 B2

CHIP PACKAGE STRUCTURE AND METHOD FOR FABRICATING THE SAME

TECHNICAL FIELD

The disclosure relates to a chip package structure, and in particular, relates to a three-dimensional chip package structure and method for fabricating the same.

BACKGROUND

Three-dimensional stacked integrated circuits (3DICs) have been developed to meet multi-functional, low cost, high density, high powered small and lightweight requirements of electronic products. A 3DIC is an IC chip having multi-layered structures.

Meanwhile, complementary metal oxide semiconductor (CMOS) chips usually have a signal level device structure because performance thereof may suffer from high temperature processes. Also, when critical dimensions of a CMOS device are reduced, signal delay problems thereof increase. Additionally, when the length of wiring between a CMOS device and a CMOS chip increase, energy consumption problems thereof increase. Accordingly, 3DIC technology has been developed to alleviate problems associated with CMOS technology.

Because the length of wiring between an IC device and a IC chip is of a 3DIC chip reduced when compared to a signal level CMOS chip, problems associated with CMOS technology such as increased signal delay, noise and energy consumption are reduced. Also, for 3DIC chips, when compared to signal level CMOS chips high frequency performance is improved when bandwidth increases. Additionally, for 3DIC technology, high density may be achieved without substantially reducing planar size. That is, fabrication of 3DIC chips may be decreased without requiring new semiconductor device technology or equipment.

Despite the above, for nanoscale semiconductor processes, fabrication yields of 3DIC chips are less than desired due to bonding problems and low yields during a through silicon via (TSV) process. A conventional TSV process includes forming through vias in a chip. Next, copper is plated to fill the through vias, thereby forming copper TSVs. In the conventional TSV process, however, copper can not be uniformly plated in the through vias. Thus, non-uniformly filled TSVs result in signal loss and reliability problems. Additionally, when a micro-bumping process is used to stack IC chips, a high solder-reflowing temperature of up to 260° C., results in thermal stress of the chips, thereby reducing product reliability.

SUMMARY

A chip package structure and method for fabricating the same are provided. An embodiment of a chip package structure comprises at least one chip having at least one through via. At least one stress buffering structure is disposed in the through via, comprising a first gasket (or plate) and a second gasket (or plate). A supporting pillar having two terminals is respectively connected to the first gasket and the second gasket, wherein the cross-sectional area of the supporting pillar is smaller than areas of the first gasket and the second gasket. A buffering layer is sandwiched between the first gasket and the second gasket, surrounding (or wrapping) a sidewall of the supporting pillar.

Another embodiment of a chip package structure comprises at least two chips vertically stacked and electrically connected with each other, wherein each of the chips has at least one through via. At least one stress buffering structure is disposed in the through via, comprising a first gasket and a second gasket. A supporting pillar having two terminals is respectively connected to the first gasket and the second gasket, wherein the cross-sectional area of the supporting pillar is smaller than areas of the first gasket and the second gasket. A buffering layer is sandwiched between the first gasket and the second gasket, surrounding a sidewall of the supporting pillar.

An embodiment of a method for fabricating a chip package structure comprises providing at least one chip. At least one through via is formed in the chip. At least one stress buffering structure is disposed in the through via, wherein the formed stress buffering structure comprises a first gasket and a second gasket. A supporting pillar having two terminals is respectively connected to the first gasket and the second gasket, wherein the cross-sectional area of the supporting pillar is smaller than areas of the first gasket and the second gasket. A buffering layer is sandwiched between the first gasket and the second gasket, surrounding a sidewall of the supporting pillar.

Another embodiment of a method for fabricating a chip package structure comprises providing at least two chips. At least one through via is respectively formed in the chips. At least one stress buffering structure is disposed in the through via, wherein the formed stress buffering structure comprises a first gasket and a second gasket. A supporting pillar having two terminals is respectively connected to the first gasket and the second gasket, wherein the cross-sectional area of the supporting pillar is smaller than areas of the first gasket and the second gasket. A buffering layer is sandwiched between the first gasket and the second gasket, surrounding a sidewall of the supporting pillar. The chips are vertically stacked and are electrically connected with each other.

BRIEF DESCRIPTION OF DRAWINGS

The embodiment can be more fully understood by reading the subsequent detailed description and examples with references made to the accompanying drawings, wherein:

FIGS. 1c and 1d show various embodiments of a method for fabricating an independently formed stress buffering structure;

FIGS. 1c-1 and 1d-1 are enlarge views of FIGS. 1c and 1d showing various embodiments of a stress buffering structure;

DETAILED DESCRIPTION OF EMBODIMENT

Figure 1A:
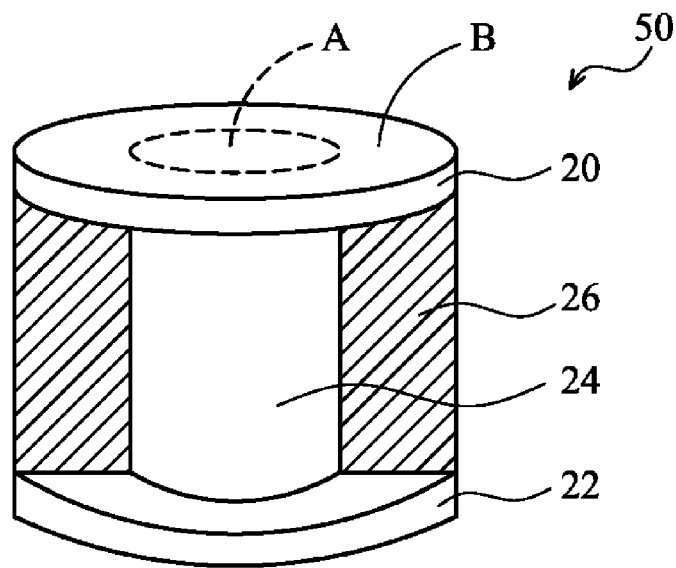
FIGS. 1a and 1b are a front schematic view and a cross section view showing one embodiment of a stress buffering structure used in a chip package structure.

The following description is of a mode for carrying out the embodiment. This description is made for the purpose of illustrating the general principles of the embodiment and should not be taken in a limiting sense. The scope of the embodiment is best determined by reference to the appended claims. Wherever possible, the same reference numbers are used in the drawings and the descriptions to refer to the same or like parts.

Embodiment provides a three-dimensional (3D) stacked chip package structure. A stress buffering structure, which can be formed independently without suffering from the conventional through silicon via (TSV) and micro-bumping processes, having an adjustable size, can be used in the chip package structure. The stress buffering structure is not only used to transmit electronic signals, but also used as a copper TSV structure because the stress buffering structure can be formed independently with the adjustable size and then disposed in a drilled silicon wafer or a drilled silicon substrate. Therefore, the stress buffering structure can solve problems associated with conventional TSVs, which can not be totally plated with copper materials. Also, process steps for the three-dimensional (3D) stacked chip package structure can be reduced, thereby reducing TSV structure fabrication cost. Meanwhile, the stress buffering structures can also be used to be substituted as micro-bumps among the chips to stack the chips using a low temperature bonding or thermal compression bonding process. Thus, mitigating the thermal stress problem for the conventional high temperature solder reflow process. The stress buffering structure can be easily fabricated. Also, the stress buffering structure is low cost, highly reliable and has low stress. Using the stress buffering structure in a three-dimensional (3D) stacked chip package structure may increase fabrication yield when compared to conventional methods.

Figure 1B:
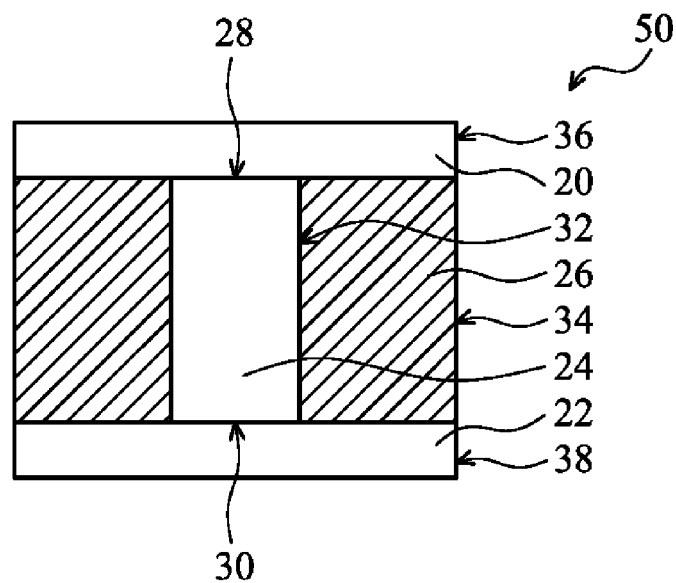

FIGS. 1a and 1b are a front schematic view and a cross section view showing one embodiment of a stress buffering structure 50 used in a chip package structure. As shown in FIGS. 1a and 1b, in one embodiment, the stress buffering structure 50 comprises a first gasket 20 and a second gasket 22, wherein the first gasket 20 and the second gasket 22 may have different areas on the surfaces opposite to the connection with the supporting pillar 24. A supporting pillar 24 has two terminals 28 and 30 respectively connected to the first gasket 20 and the second gasket 22. From the upper view of FIG. 1a (that is, from the top view), a cross-sectional area A of the supporting pillar 24 is smaller than an area B of the first gasket 20 or the second gasket 22, respectively. In one embodiment, the first gasket 20, the second gasket 22 and the supporting pillar 24 may comprise the same materials. Therefore, referring to the cross section view of the stress buffering structure 50 as shown in FIG. 1b, the first gasket 20, the second gasket 22 and the supporting pillar 24 of the stress buffering structure 50 are formed a I-shaped conductive structure. Additionally, the stress buffering structure 50 further comprise a buffering layer 26 sandwiched between the first gasket 20 and the second gasket 22, surrounding a sidewall of the supporting pillar 24. An outer sidewall 34 of the buffering layer 26 may be respectively coplanar with an outer sidewall 36 of the first gasket 20 and an outer sidewall 38 of the second gasket 22. In one embodiment, the buffering layer 26 may comprise polyimide (PI), Ajinomoto build-up film (ABF) or low dielectric constant (k) polymer materials. The buffering layer 26 can adsorb or release stress of the stress buffering structure 50.

Figures 1, 1D:
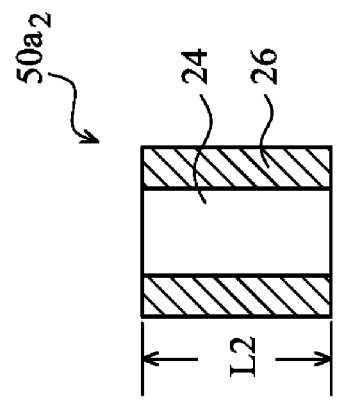
Figure 1D:
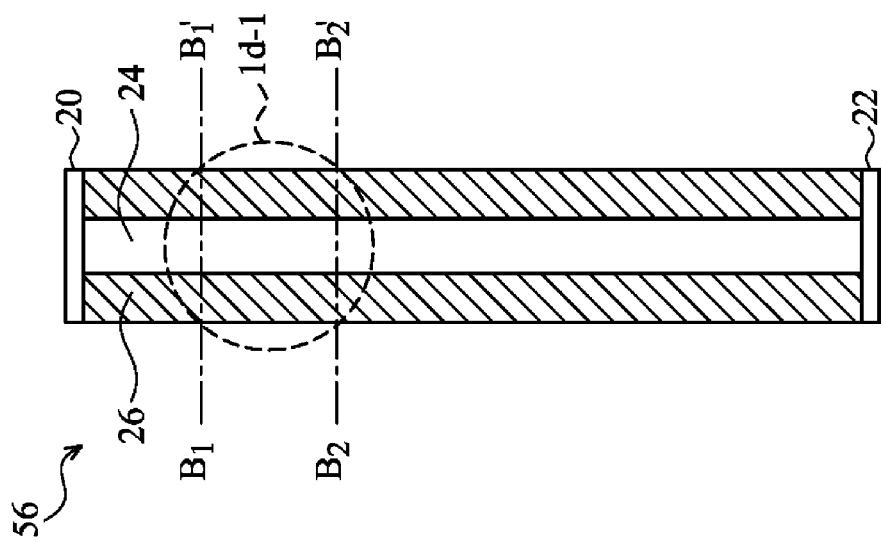

Embodiments of the stress buffering structure can be formed independently and then divided into several stress buffering structures with the fixed or variable lengths. FIGS. 1c and 1d show various embodiments of a method for fabricating an independently formed stress buffering structure. FIGS. 1c-1 and 1d-1 are enlarge views of FIGS. 1c and 1d showing various embodiments of a stress buffering structure. As shown in FIGS. 1c and 1c-1, one embodiment of a long-shaped stress buffering structure 52 may be firstly formed. The long-shaped stress buffering structure 52 may be independently formed by vertically laminating a plurality of the supporting pillar 24, wherein two terminals of each of the supporting pillar 24 respectively connected to a gasket 54. The upper terminal of the uppermost supporting pillar 24 and the lower terminal of the lowermost supporting pillar 24 respectively connect the gasket 54. Also, a sidewall of each of the supporting pillar 24 may be surrounded by a buffering layer 26. The each buffering layer 26 is sandwiched between the two adjacent gaskets 54. Next, the long-shaped stress buffering structure 52 may be cut to divide into several stress buffering structures with the fixed or variable lengths. For example as shown in FIGS. 1c and 1c-1, a stress buffering structure $50a_1$ may be divided from the long-shaped stress buffering structure 52 by cutting the long-shaped stress buffering structure 52 along lines $A_1$-$A_1'$ and $A_2$-$A_2'$ located on the gaskets 54. The stress buffering structure $50a_1$ comprising a first and a second gaskets 20 and 22, a supporting pillar 24, and a buffering layer 26 has the same configuration as the stress buffering structure 50a as shown in FIGS. 1a and 1b. A length $L_1$ of the stress buffering structure $50a_1$ may adjustable by design.

As shown in FIGS. 1d and 1d-1, another embodiment of a long-shaped stress buffering structure 56 may be independently formed. The long-shaped stress buffering structure 56 comprising a first and a second gaskets 20 and 22, a supporting pillar 24, and a buffering layer 26 has the same configuration as the stress buffering structure 50a as shown in FIGS. 1a and 1b. Next, the long-shaped stress buffering structure 56 may be cut to divide into several stress buffering structures with the fixed or variable lengths. For example as shown in FIGS. 1d and 1d-1, a stress buffering structure $50a_2$ may be divided from the long-shaped stress buffering structure 56 by cutting the long-shaped stress buffering structure 56 along lines $B_1$-$B_1'$ and $B_2$-$B_2'$ located between the first and the second gaskets 20 and 22. The stress buffering structure $50a_2$ comprises a supporting pillar 24, and a buffering layer 26 surrounding the supporting pillar 24. A length $L_2$ of the stress buffering structure $50a_2$ may be adjustable by design.

Figure 2A:
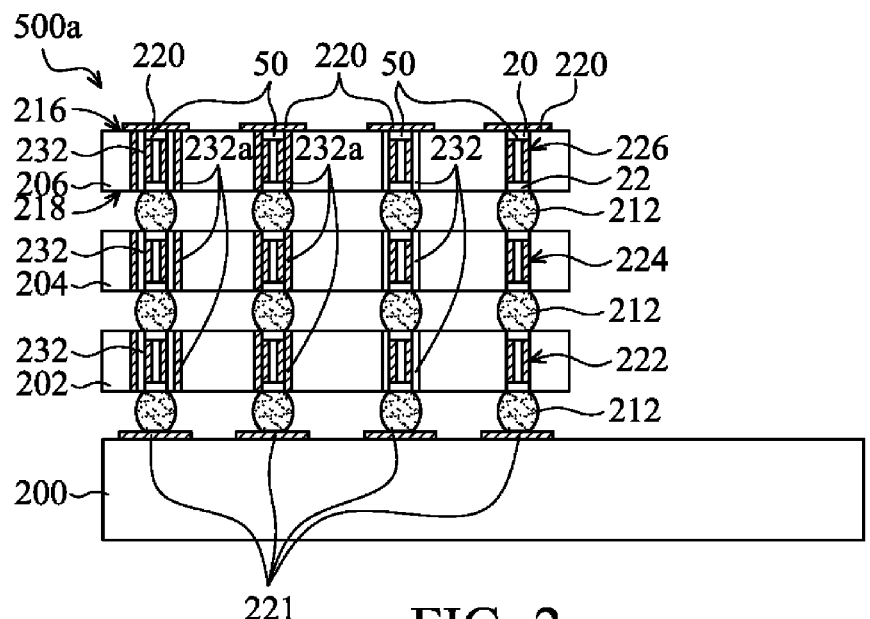
FIGS. 2a to 6 are cross section views showing embodiments of the chip package structure.

The stress buffering structures 50, $50a_1$ and $50a_2$ as shown in FIGS. 1a, 1c and 1d can be used as a TSV structure of a 3D stacked chip package structure to transmit electronic signals. FIGS. 2a to 6 are cross section views showing embodiments of the chip package structures 500a to 500g. The chip package structures 500a to 500g are described as embodiments of the 3D (stacked vertically) chip package structure as three stacked chips. The number of chips of the chip package structure is not limited and according to design. FIG. 2a is a cross section view showing one embodiment of the chip package structure 500a. As shown in FIG. 2a, chips 202, 204 and 206 are provided. In one embodiment, electronic devices (not shown) may be disposed on upper or lower surfaces of the chips 202, 204 and 206. Next, a plurality of through vias 222, 224 and 226 may be formed through the chips 202, 204 and 206 by processes such as laser drilling. Next, the stress buffering structures 50, serving as TSV structures of the chips 202, 204 and 206, are disposed in the through vias 222, 224 and 226. The first gasket 20 and the second gasket 22 of the stress buffering structure 50 in each of the chips 202, 204 and 206 may be electrically connected to the electronic devices disposed on upper or lower surfaces of the chips 202, 204 and 206 to transmit electronic signals. For example, the first gasket 20 of the stress buffering structure 50 disposed in the chip 202 can be electrically connected to the electronic devices disposed on the upper surface of the chip 202, and the second gasket 22 can be electrically connected to the electronic devices disposed on the lower surface of the chip 202. As shown in FIG. 2a, the first gasket 20 and the second gasket 22 of the stress buffering structure 50 in the each chip 202, 204 or 206 can be respectively coplanar with a top surface and a bottom surface of the each chip 202, 204 or 206. For example, the first gasket 20 and the second gasket 22 of the stress buffering structure 50 in the chip 206 can be respectively coplanar with an upper surface and a lower surface of the chip 206. Next, as shown in FIG. 2a, micro-bumps 212 can be disposed between the chips 202 and 204 and the chips 204 and 206. Therefore, the chips 202, 204 and 206 can be vertically stacked through the micro-bumps 212 by a solder reflow or hot pressing process, wherein the through vias 222, 224 and 226 can be aligned with each other. Also, the micro-bumps 212 can be electrically connected to the stress buffering structure 50 in the upper or lower chip. The stress buffering structures 50 in the chips 202, 204 and 206 can be electrically connected with each other through the micro-bumps 212. Also, the stacked chips 202, 204 and 206 can be electrically connected to the bonding pads 220 through the micro-bumps 212.

Figure 2B:
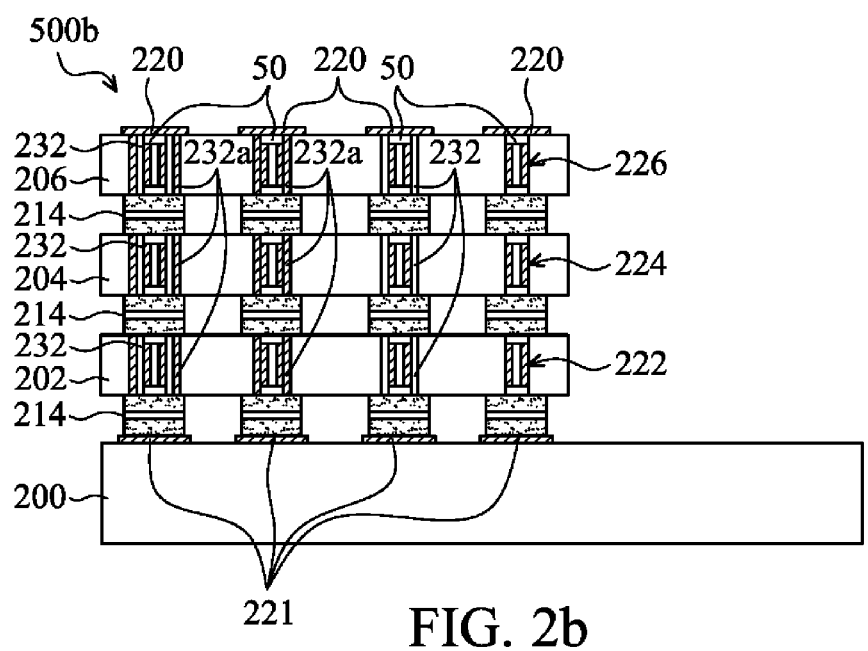

In another embodiment, metal-bumps can be also used as electrical connections among the chips of the 3D chip package structure. The metal-bump is constructed by two metal gaskets, for example, copper gaskets, a thermally and electrically conductive material, and a metal material, for example, Sn, sandwich between the two metal gaskets. The metal gaskets of the metal-bump are electrically connected to the first gasket 20 or the second gasket 22 of the stress buffering structure 50. Also, the metal gaskets of the metal-bumps, the first gasket 20 and the second gasket 22 may have the same materials, thereby mitigating the stress problem that results from a mismatch in coefficient of thermal expansion (CTE) among the metal gaskets of the metal-bumps, the first gasket 20 and the second gasket 22. For example, the chip package structure 500b as shown in FIG. 2b uses metal-bumps 214 disposed between the chips 202 and 204 and the chips 204 and 206. Therefore, the chips 202, 204 and 206 can be vertically stacked through the metal-bumps 214 by a solder reflow or hot pressing process. Also, the metal-bumps 214 can be electrically connected to the stress buffering structure 50 in the upper or lower chip. The chips 202, 204 and 206 can be electrically connected with each other through the metal-bumps 214. The stress buffering structures 50 in the chips 202, 204 and 206 can be electrically connected to the electronic devices respectively disposed on the upper or the lower surface of the chips 202, 204 and 206 through the bonding pads 220 and the metal-bumps 214. Also, the stacked chips 202, 204 and 206 can be electrically connected to bonding pads 221 of the substrate through the metal-bumps 214.

Figure 3:
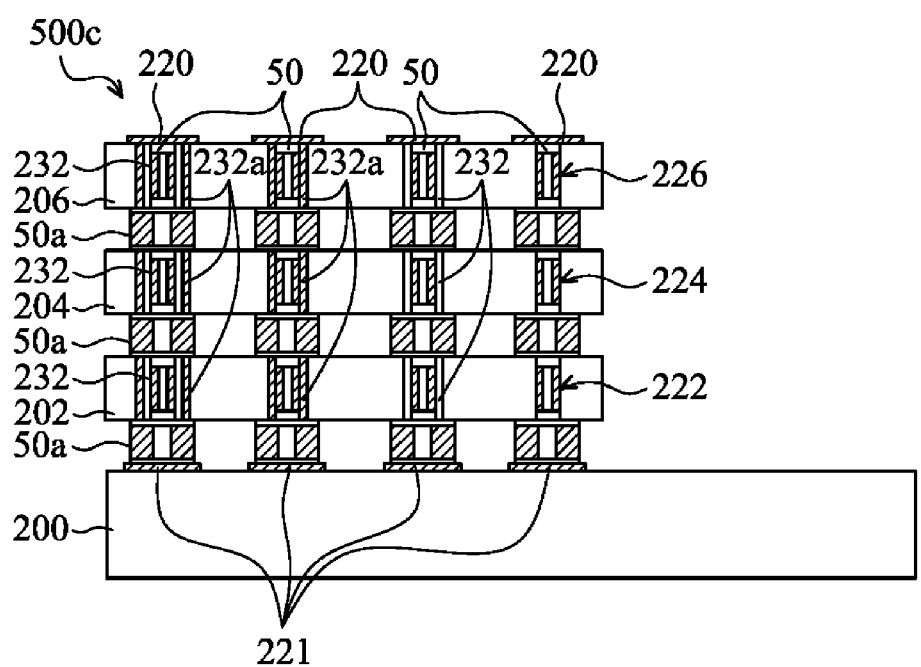

In yet another embodiment, another stress buffering structure 50a having same or different sizes can be used to replace the micro-bumps 212 as shown in FIG. 2a or the metal-bumps 214 as shown in FIG. 2b for electrical connections among the chips. FIG. 3 is a cross section view showing yet another embodiment of the chip package structure 500c. As shown in FIG. 3, a stress buffering structure 50a can be disposed between the chips 202 and 204 or the chips 204 and 206 by a solder reflow or hot pressing process, thereby stacked the chips 202, 204 and 206 vertically. As shown in FIG. 3, the stress buffering structures 50a disposed between the chips are electrically connected to the stress buffering structures 50 disposed in the chips. Therefore, the stress buffering structures 50 disposed in the chips 202, 204 or 206 can be respectively electrically connected to the electronic devices disposed on the upper surface or the lower surface of the chips 202, 204 or 206 through the bonding pads 220 or the stress buffering structures 50a. Additionally, the stacked chips can be electrically connected to the bonding pads 221 through the stress buffering structures 50a. Formation of yet another embodiment of the chip package structure 500c can mitigate using the high temperature solder reflowing process used in the conventional micro-bumping technology, thereby reducing thermal stress of the chip package structure 500c. Additionally, the stress buffering structures 50 and 50a disposed in the through vias of chips or among the chips may have the same coefficient of thermal expansion (CTE), thereby reducing the stress problem resulting from mismatch CTE thereamong. Therefore, reliability of the chip package structure can be improved when using the stress buffering structures.

Figure 4:
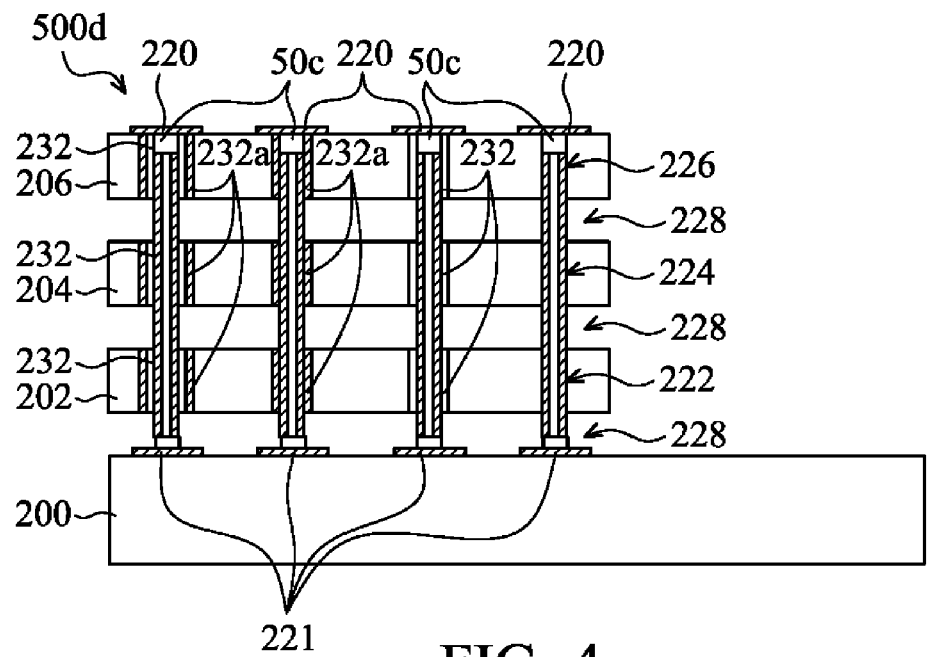
Figure 5:
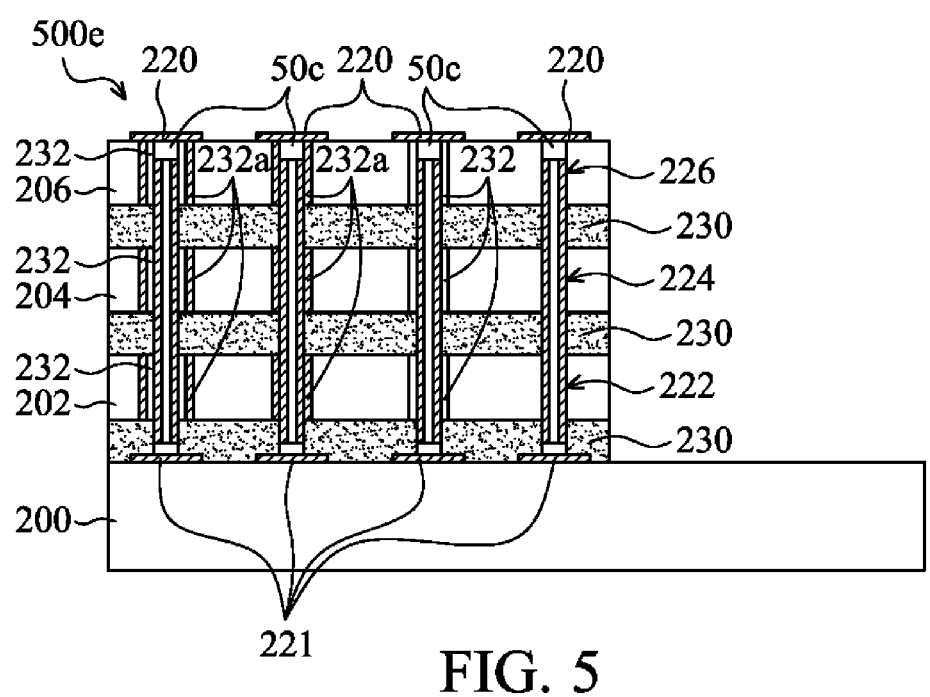

Alternatively, a single stress buffering structure can be used as the TSV structure and the micro-bump (or the metal-bumps) of the chip package structure. FIGS. 4 and 5 are cross section views showing other embodiments of the chip package structures 500d and 500e. As shown in FIGS. 4 and 5, a longer stress buffering structure 50c can be used to penetrate the stacked chips 202, 204 and 206 of the chip package structure 500d or 500e. Therefore, the stress buffering structure 50c can be used as the electrical connections in the inside of and among the chips 202, 204 and 206. Also, the stacked chips can be electrically connected to the bonding pads 221 of the substrate 200 and the bonding pads 220 on the chip 206 using the same stress buffering structure 50c. In these embodiments, spaces 228 exist among the chips 202, 204 and 206 or between the chip 202 and the substrate 200. As shown in FIG. 5, in the chip package structure 500e, a filling layer 230 may be used to fill the spaces 228 among the chips 202, 204 and 206 or between the chip 202 and the substrate 200. Also, the stress buffering structure 50c may penetrate through the filling layer 230. In one embodiment, commonly used underfill materials, interposed layer materials, spacer materials or nanocomposite materials can be used as the filling layer 230. For example, the filling layer 230 may comprise epoxy, ceramic, polyimide (PI) or Ajinomoto build-up film (ABF). When the filling layer 230 comprises nanocomposite materials, the nanocomposite materials may comprise a nanocomposite containing glass, epoxy and metal nano particles or a nanocomposite containing carbon fibers, epoxy and metal nano particles.

Additionally, in embodiments as shown in FIGS. 2a to 5, the stress buffering structure disposed in the through via of the chip may have the same size with the through via or have a smaller size than the through via, thereby allowing an outer sidewall of the stress buffering structure to adhere to an inner sidewall of the through via or allow a space between the outer sidewall of the stress buffering structure and the inner sidewall of the through via. For example, in one embodiment as shown in FIGS. 2a to 5, spaces 232 may exist between the stress buffering structures 50 or 50c and the through vias 222, 224 and 226. Alternatively, the chip package structures 500a to 500e may further comprise insulating layers 232a disposed on sidewalls of the through vias 222, 224 and 226, surrounding the stress buffering structures 50 or 50c. Moreover, in another embodiment, a space 232 filled by air (that is no filling materials are in the spaces 232) may also exist between the sidewall of the stress buffering structures 50 or 50c and the insulating layer 232a. The insulating layers 232a may comprise polyimide (PI), Ajinomoto build-up film (ABF) or silicon oxide. The spaces 232 and the insulating layers 232a have functions of releasing interface stress between the stress buffering structures and the chips.

Figure 6:
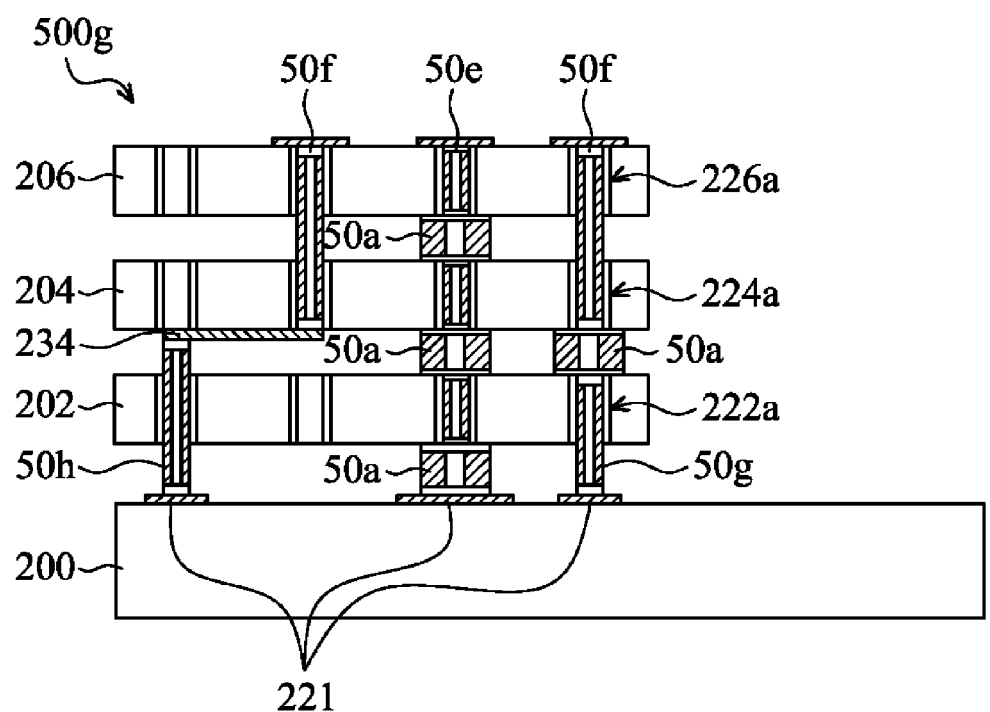

Therefore, the embodiments of the stress buffering structure of the chip package structure may have arbitrary sizes and be disposed in the through vias or among the stacked chips. The stress buffering structures may not only replace the conventional TSV structure, but also replace the micro-bump/metal-bumps among the stacked chips. In the chip package structure 500g as shown in FIG. 6, different sized stress buffering structures 50a, 50e, 50f, 50g or 50h may be used as electrical connections in the chips or among the chips. The chip package structure 500g as shown in FIG. 6 uses the stress buffering structures 50a, 50e, 50f, 50g or 50h, which are separated from the chips 202, 204 and 206 by spaces. For example, the stress buffering structures 50e disposed in the through vias 222a, 224a or 226a of the signal chip 202, 204 or 206 may serve as electrical connections in the chip 202, 204 or 206. The stress buffering structures 50f through the chips 202 and 204 may be used as electrical connections in the chips and among the chips. The stress buffering structure 50g may be used as an electrical connection between the chip 202 and the substrate 200. The stress buffering structure 50h may be electrically connected to the stress buffering structure 50f through a conductive trace 234, serving as an electrical connection between the chip 206 and the substrate 200. Additionally, the stress buffering structures 50a or the conductive trace 234 may be used as electrical connections among the stacked chips to transmit signals therethrough.

Figure 7A:
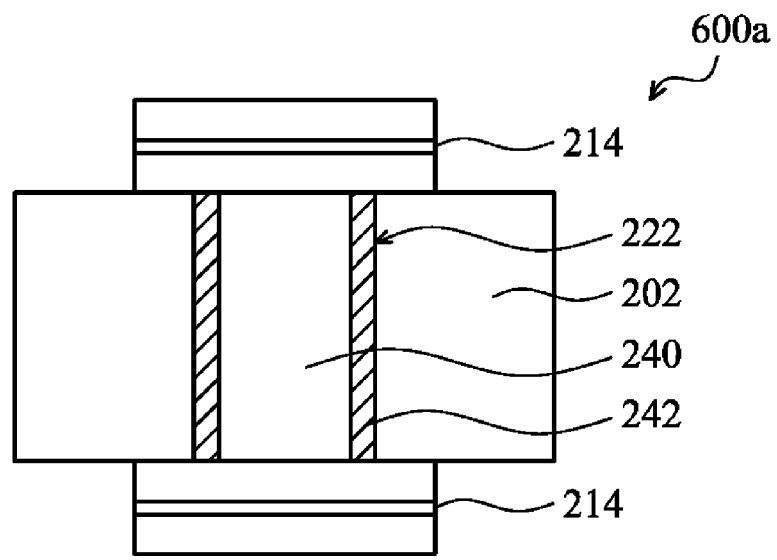
FIG. 7a is a schematic view showing stress analysis of a conventional chip package structure having a Cu through silicon via.
Figure 7B:
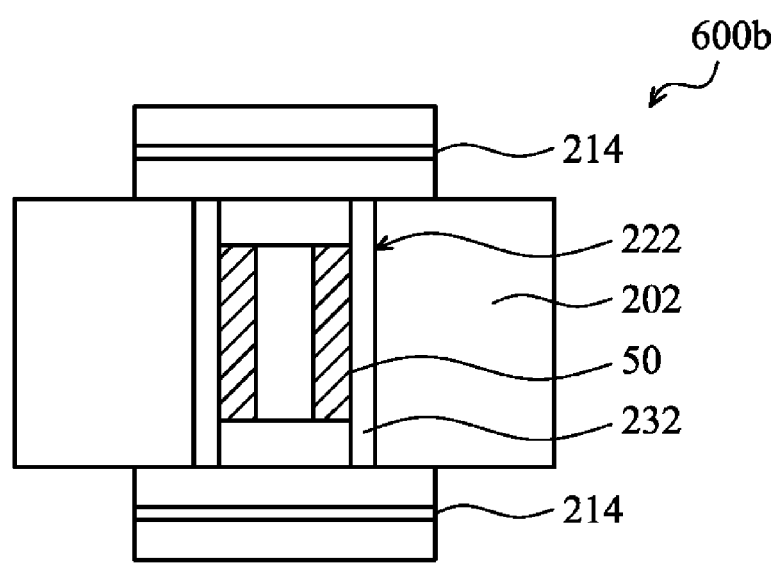
FIGS. 7b to 7e are schematic views showing stress analysis of embodiments of the chip package structure.
Figure 7C:
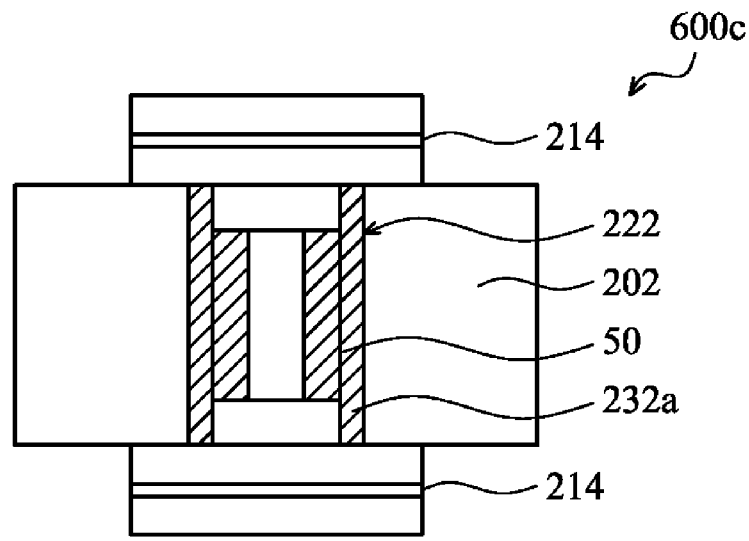
Figure 7D:
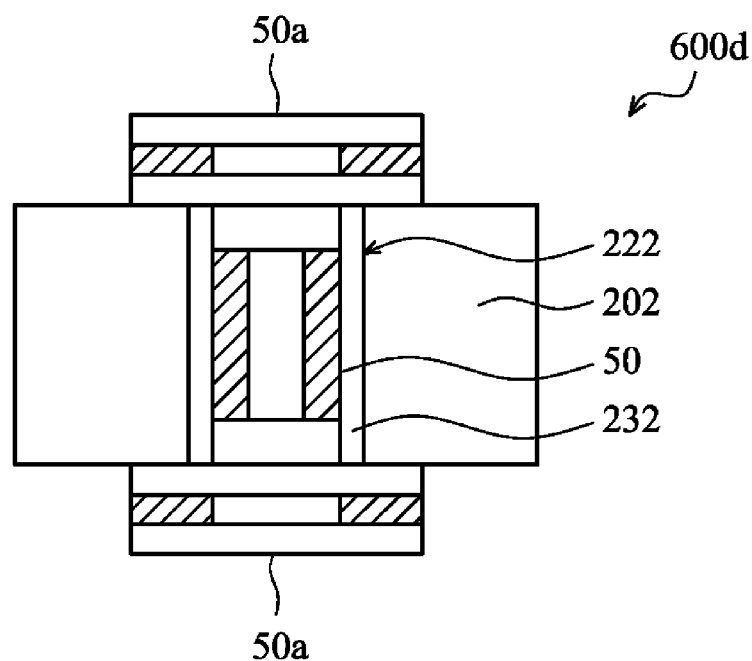
Figure 7E:
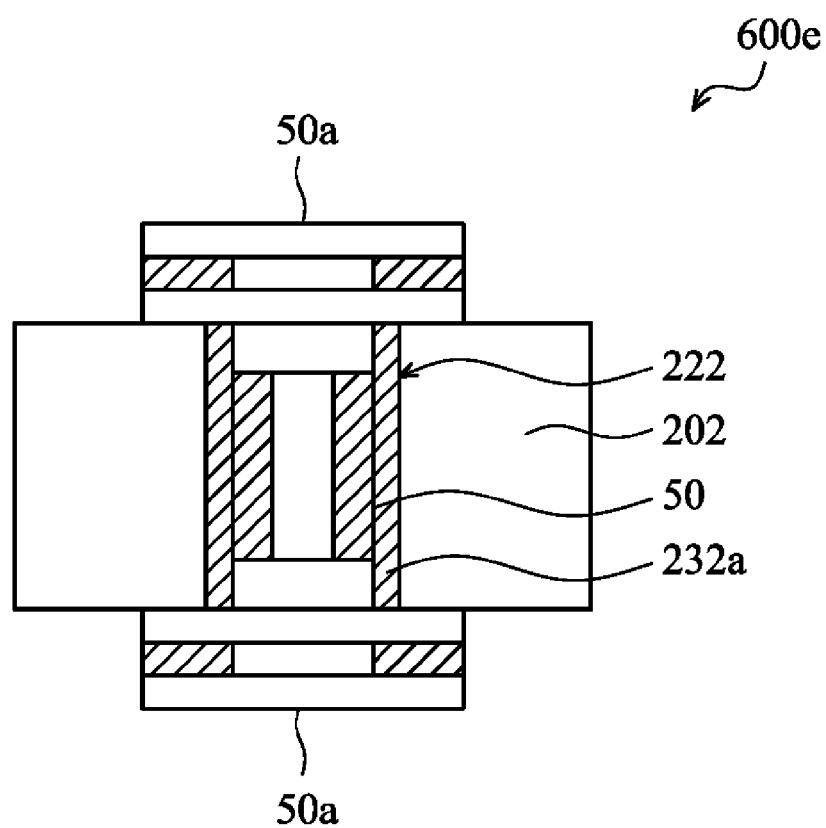

The ANSYS finite element software can be used to analyze the stress of the conventional TSV chip package structure as show in FIG. 7a and embodiments of the stress buffering structure of the chip package structure as shown in FIGS. 7b to 7e, to show high reliability, low stress and increased fabrication yield of the stress buffering structure of the chip package structure. The stress test result is measured under a temperature condition of about 25° C. to about 125° C. FIG. 7a is a schematic view showing a conventional chip package structure 600a having a Cu TSV structure 240 formed by an electroplating process for stress analysis, wherein an insulating layer 242 is disposed between the TSV structure 240 and the through via 222. FIG. 7b is a schematic view showing one embodiment of the chip package structure 600b for stress analysis. In the chip package structure 600b, a fabricated stress buffering structure 50 is used as the source for electrical connections in the chip 202. The conventional metal-bumps 214 are used as the source for electrical connections between the chip 202 and other stacked chips. Also, a space 232 is between the stress buffering structure 50 and the through via 222. FIG. 7c is a schematic view showing another embodiment of the chip package structure 600c for stress analysis. In the chip package structure 600c, a fabricated stress buffering structure 50 is used as the source for electrical connections in the chip 202. The conventional metal-bumps 214 are used as the source for electrical connections between the chip 202 and other stacked chips. Also, an ABF insulating layer 232a is filled in the space between the stress buffering structure 50 and the through via 222. FIG. 7d is a schematic view showing yet another embodiment of the chip package structure 600d for stress analysis. In the chip package structure 600b, the fabricated stress buffering structure 50 is used as the source for electrical connections in the chip 202. The fabricated stress buffering structures 50a are used as the source for electrical connections between the chip 202 and other stacked chips. Also, a space 232 is between the stress buffering structure 50 and the through via 222. FIG. 7e is a schematic view showing yet another embodiment of the chip package structure 600e for stress analysis. The differences between the chip package structure 600d and the chip package structure 600e is an ABF insulating layer 232a filled in the space between the stress buffering structure 50 and the through via 222.

TABLE 1

The stress analysis result of the conventional chip package structure and embodiments of the chip package structure.

|  | The conventional chip package structure 600a | The chip package structure 600b | The chip package structure 600c | The chip package structure 600d | The chip package structure 600e |
|---|---|---|---|---|---|
| Maximum stress for the chip (MPa) | 200.335 | 126.804 | 182.339 | 135.993 | 196.407 |
| Maximum stress for the through via and the stress buffering structure or for the through via and the metal-bumps (MPa) | 184.684 | 172.276 | 183.471 | 143.408 | 160.929 |
| Maximum stress for the through via (MPa) | 81.388 | 96.868 | 80.597 | 59.822 | 49.051 |
| Percentage that stress is reduced for the chip when compared to the conventional chip package structure 600a | N/A | 36.71% | 8.98% | 32.12% | 1.96% |
| Percentage that stress is reduced for the through via when compared to the conventional chip package structure 600a | N/A | +19.02% | 0.97% | 28.96% | 39.18% |

From the Table 1, compared with the conventional chip package structure 600a, the chip package structure 600c having the stress buffering structure 50 serving as the TSV structure and the ABF insulating layer 232a between the stress buffering structure 50 and the chip 202, has stress for the chip reduced by 9% and stress for the through via reduced by 1%. Compared with the conventional chip package structure 600a, the chip package structure 600b has stress for the chip reduced by 37%. Also, although stress on the through via is increased, the stress is smaller than 210 Ma, the ultimate tensile stress of copper material. Thus, despite, reliability of the chip package structure 600b is not negatively effected. Compared with the conventional chip package structure 600a, the chip package structure 600e, which uses the stress buffering structures as the TSV structure and the metal-bumps, has stress for the chip reduced by 2% and stress for the through via reduced by 39%. Additionally, the chip package structure 600d has stress for the chip reduced by 32% and stress for the through via reduced by 29% when compared with the conventional chip package structure 600a. The stress analysis results show that the stress buffering structures using as the TSV structure and the metal-bumps of the chip package structure have improved stress releasing effects.

While the embodiment has been described by way of example and in terms of the preferred embodiments, it is to be understood that the embodiment is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package structure, comprising:
   at least one chip having at least one through via; and
   at least one stress buffering structure disposed in the through via, comprising:
     a first gasket and a second gasket;
     a supporting pillar having two terminals respectively connected to the first gasket and the second gasket, wherein the cross-sectional area of the supporting pillar is smaller than areas of the first gasket and the second gasket; and
     a buffering layer sandwiched between the first gasket and the second gasket, surrounding a sidewall of the supporting pillar.

2. The chip package structure as claimed in claim 1, further comprising a space between a sidewall of the stress buffering structure and said at least one through via.

3. The chip package structure as claimed in claim 1, further comprising an insulating layer disposed on a sidewall of the through via, surrounding the stress buffering structure.

4. The chip package structure as claimed in claim 3, further comprising a space between a sidewall of the stress buffering structure and the insulating layer.

5. The chip package structure as claimed in claim 3, wherein the insulating layer comprises polyimide, Ajinomoto build-up film (ABF) or silicon oxide.

6. The chip package structure as claimed in claim 1, wherein an area of the stress buffering structure is smaller than that of the through via.

7. The chip package structure as claimed in claim 1, wherein an outer sidewall of the stress buffering structure is coplanar with outer sidewalls of the first and second gaskets.

8. The chip package structure as claimed in claim 1, wherein the first and second gaskets are respectively coplanar with a top surface and a bottom surface of the at least one chip.

9. The chip package structure as claimed in claim 1, wherein the first and second gaskets and the supporting pillar comprise metals or a thermally and electrically conductive material.

10. The chip package structure as claimed in claim 1, wherein the buffering layer comprises polymer.

11. The chip package structure as claimed in claim 1, wherein the stress buffering structure is electrically connected to the at least one chip.

12. The chip package structure as claimed in claim 1, wherein the chip comprising at least two chips vertically stacked and electrically connected with each other, wherein each of the chips has at least one through via; and at least one stress buffering structure disposed in the through via.

13. The chip package structure as claimed in claim 12, wherein the chips are electrically connected with each other through a conductive feature, and the conductive feature is electrically connected to the stress buffering structure of each of the at least two chips.

14. The chip package structure as claimed in claim 13, wherein the conductive feature comprises a micro bump, a metal bump, a conductive wire or another stress buffering structure.

15. The chip package structure as claimed in claim 12, wherein the stress buffering structure penetrates through the at least two chips.

16. The chip package structure as claimed in claim 15, further comprising a filling layer sandwiched between the at least two chips, wherein the stress buffering structure penetrates through the filling layer.

17. A method for fabricating a chip package structure, comprising:
   providing at least one chip;
   forming at least one through via in the chip; and
   disposing at least one stress buffering structure in the through via, wherein the formed stress buffering structure comprises:
     a first gasket and a second gasket;
     a supporting pillar having two terminals respectively connected to the first gasket and the second gasket, wherein the cross-sectional area of the supporting pillar is smaller than areas of the first gasket and the second gasket; and
     a buffering layer sandwiched between the first gasket and the second gasket, surrounding a sidewall of the supporting pillar.

18. The method for fabricating a chip package structure as claimed in claim 17, further comprising forming a space between a sidewall of the stress buffering structure and the at least one through via.

19. The method for fabricating a chip package structure as claimed in claim 17, further comprising forming an insulating layer on a sidewall of the through via, surrounding the stress buffering structure.

20. The method for fabricating a chip package structure as claimed in claim 19, further comprising forming a space between a sidewall of the stress buffering structure and the insulating layer.

21. The method for fabricating a chip package structure as claimed in claim 17, wherein the through via made of a laser drilling or a plasma etching process.

* * * * *